(12) United States Patent
Lee et al.

(10) Patent No.: US 9,500,501 B2
(45) Date of Patent: Nov. 22, 2016

(54) STARTUP CIRCUIT, CAPACITIVE SENSOR AMPLIFICATION DEVICE HAVING STARTUP CIRCUIT, AND STARTUP METHOD FOR AMPLIFICATION DEVICE

(71) Applicant: CESIGN CO., LTD., Seongnam-si (KR)

(72) Inventors: Soo Hyoung Lee, Hwaseong-si (KR); Jae Young Shin, Yongin-si (KR); Justin Jungsup Kim, Yongin-si (KR)

(73) Assignee: CESIGN CO., LTD. (KR)

( * ) Notice: Subject to any disclaimer, the term of this patent is extended or adjusted under 35 U.S.C. 154(b) by 0 days.

(21) Appl. No.: 14/405,016

(22) PCT Filed: May 27, 2013

(86) PCT No.: PCT/KR2013/004589
§ 371 (c)(1),
(2) Date: Dec. 2, 2014

(87) PCT Pub. No.: WO2014/189164
PCT Pub. Date: Nov. 27, 2014

(65) Prior Publication Data
US 2016/0061633 A1    Mar. 3, 2016

(30) Foreign Application Priority Data

May 22, 2013 (KR) ......................... 10-2013-0057572

(51) Int. Cl.
*G01R 19/257* (2006.01)
*G01D 5/24* (2006.01)
(Continued)

(52) U.S. Cl.
CPC ............... *G01D 5/24* (2013.01); *H03F 1/305* (2013.01); *H03F 3/45475* (2013.01); *H03F 2200/78* (2013.01); *H03F 2203/45528* (2013.01)

(58) Field of Classification Search
CPC .............. G01R 23/005; G01R 19/257; G01R 27/2605; G01R 19/0038; G05F 1/467; H02M 3/07; G01D 5/24; H03F 1/305; H03F 3/45475; H03F 2203/45528; H03F 2200/78; H03F 1/56; H03F 3/181; H04R 19/04; G10K 11/00; H04M 1/05; H04M 1/6058
See application file for complete search history.

(56) References Cited

U.S. PATENT DOCUMENTS

| 8,093,948 B2 | 1/2012 | Kim et al. |
| 2006/0008097 A1* | 1/2006 | Stenberg ............... H04R 19/04 381/113 |

(Continued)

FOREIGN PATENT DOCUMENTS

| JP | 2011229063 | 11/2011 |
| KR | 1020110075709 | 7/2011 |

(Continued)

OTHER PUBLICATIONS

International Search Report—PCT/KR2013/004589 dated Feb. 21, 2014.

*Primary Examiner* — Son Le
(74) *Attorney, Agent, or Firm* — Cantor Colburn LLP

(57) ABSTRACT

In accordance with a startup circuit, a capacitive sensor amplification device having the startup circuit, and a startup method for the amplification device, a startup time can be shortened by connecting the high impedance resistor of an amplifier to a predetermined voltage source during startup. The capacitive sensor amplification device includes an amplification unit for amplifying a signal input to the amplification device; and a startup circuit for improving a startup time of the amplification unit, wherein the startup circuit includes a comparator for receiving an output of the amplification unit as a first comparison signal, receiving a preset reference voltage as a second comparison signal, comparing the comparison signals with each other, and outputting a comparison result; and a switch for selecting and outputting one of a first voltage and a second voltage depending on the output of the comparator.

5 Claims, 3 Drawing Sheets

(51) Int. Cl.
*H03F 1/30* (2006.01)
*H03F 3/45* (2006.01)

(56) References Cited

U.S. PATENT DOCUMENTS

2011/0090009 A1 4/2011 Van Veldhoven
2013/0051582 A1 2/2013 Kropfitsch et al.
2014/0008087 A1* 1/2014 Brown ................ B25F 3/00
173/1

FOREIGN PATENT DOCUMENTS

KR 1020110123316 11/2011
KR 1020120122162 11/2012

* cited by examiner

STARTUP CIRCUIT, CAPACITIVE SENSOR AMPLIFICATION DEVICE HAVING STARTUP CIRCUIT, AND STARTUP METHOD FOR AMPLIFICATION DEVICE

BACKGROUND OF THE INVENTION

1. Field of the Invention

The present invention relates generally to a startup circuit, a capacitive sensor amplification device having the startup circuit, and a startup method for the amplification device and, more particularly, to a startup circuit that is capable of setting the initial startup time of a capacitive sensor amplification device to a short time and to a capacitive sensor amplification device having the startup circuit and a startup method for the amplification device.

2. Description of the Prior Art

A condenser microphone is a microphone for converting sounds into electrical signals according to a variation in the capacitance of a condenser, and is also referred to as a "capacitor microphone."

In particular, an Electret Condenser Microphone (ECM) is characterized in that an existing post-processing stage may be remarkably simplified and noise interference in analog signals may be eliminated. A capacitor microphone is designed using a capacitive sensor, and the output of the capacitive sensor needs to be amplified.

FIG. 1 is a configuration diagram showing an embodiment of a conventional capacitive sensor amplification device 100. As can be seen in FIG. 1, the conventional capacitive sensor amplification device 100 functions to amplify a signal output from a sensor circuit CS, and includes an impedance unit 110 and an amplification unit 120. The sensor circuit CS includes a capacitive sensor (Cmic), and the amplification unit 120 functions to amplify the output signal of the capacitive sensor Cmic.

The capacitive sensor amplification device 100 is capable of transferring a signal only when the output stage of the capacitive sensor Cmic that is a condenser for a microphone is maintained at a high impedance state. Therefore, the input stage of an integrated circuit that receives the signal from the capacitive sensor Cmic has the impedance unit 110 having high impedance. That is, in the amplification device 100 implemented as an integrated circuit for receiving the signal from the capacitive sensor Cmic, an embodiment of a typical circuit is a structure in which a high impedance resistive component is arranged at the input node of an amplifier AMP so as to maintain the input stage of the amplification device 100 at high impedance and form a Direct Current (DC) bias. Typically, the resistance of a high impedance resistive component is implemented as several Giga ohms (GΩ) to several tens of Giga ohms or more. By such a high impedance value, the bias of the input stage node of the amplification device 100 may be uniformly maintained.

When the above-described high impedance is implemented, a problem arises in that the time for which a DC bias is formed in the initial operation of a circuit is greatly lengthened.

Korean Patent Application Publication No. 10-2012-0122162 (entitled "Electret condenser microphone with variable input impedance pre-amplifier and variable input impedance controlling method of the pre-amplifier") discloses a method for causing the DC bias level of the input signal of an amplifier to promptly converge on an operating region using a variable impedance element.

That is, Korean Patent Application Publication No. 10-2012-0122162 discloses a method for initially controlling the DC bias level of the input signal of the amplifier using an indirect method. However, there is a need to implement a startup circuit using a more direct, faster, and simpler circuit.

SUMMARY OF THE INVENTION

The present invention has been made keeping in mind the above technical problems, and an object of the present invention is to provide a startup circuit that is capable of shortening a startup time by connecting the high impedance resistor of an amplifier to a predetermined voltage source during startup, a capacitive sensor amplification device having the startup circuit, and a startup method for the amplification device.

A startup circuit for an electronic device according to a preferred embodiment of the present invention includes a comparator for receiving an output of the electronic device as a first comparison signal, receiving a preset reference voltage as a second comparison signal, comparing the comparison signals with each other, and outputting a comparison result; and a switch for selecting and outputting one of a first voltage and a second voltage depending on the output of the comparator. The output of the switch may be connected to the electronic device. In detail, the first voltage may be a voltage greater than either a supply voltage applied to the electronic device or the reference voltage, and the second voltage may be a ground voltage applied to the electronic device. Further, the startup circuit may be configured to, when the first comparison signal is equal to or greater than the second comparison signal, select and output the first voltage, and when the first comparison signal is less than the second comparison signal, select and output the second voltage.

A capacitive sensor amplification device according to a preferred embodiment of the present invention includes an amplification unit for amplifying a signal input to the amplification device; and a startup circuit for improving a startup time of the amplification unit, wherein the startup circuit includes a comparator for receiving an output of the amplification unit as a first comparison signal, receiving a preset reference voltage as a second comparison signal, comparing the comparison signals with each other, and outputting a comparison result; and a switch for selecting and outputting one of a first voltage and a second voltage depending on the output of the comparator. In addition, the capacitive sensor amplification device may further include an impedance unit having a first end connected to the output of the switch and a second end connected to an output of a capacitive sensor, the impedance unit having an impedance value corresponding to a predetermined value or more.

In detail, the amplification unit may be connected to the first end of the impedance unit and is configured to amplify the output of the capacitive sensor. The first voltage may be a voltage greater than either a supply voltage applied to the amplification unit or the reference voltage, and the second voltage may be a ground voltage applied to the amplification unit. Further, the startup circuit may be configured to, when the first comparison signal is equal to or greater than the second comparison signal, select and output the first voltage, and when the first comparison signal is less than the second comparison signal, select and output the second voltage.

A startup method for a capacitive sensor amplification device according to a preferred embodiment of the present invention includes (a) comparing an output signal of the amplification device with a preset reference value; and (b) selecting and outputting one of a first voltage and a second voltage depending on a comparison result obtained at (a). In detail, (b) may include (b-1) when the output signal of the amplification device is equal to or greater than the reference voltage, selecting and outputting the first voltage; and (b-2) when the output signal of the amplification device is less than the reference voltage, selecting and outputting the second voltage. Further, the first voltage may be a voltage greater than either a supply voltage applied to the amplification device or the reference voltage, and the second voltage may be a ground voltage applied to the amplification device. Furthermore, the output at (b) may be provided to a first end of an impedance unit that is included in the amplification device and that has an impedance value corresponding to a predetermined value or more.

In accordance with the startup circuit, the capacitive sensor amplification device having the startup circuit, and the startup method for the amplification device according to the embodiment of the present invention, a startup time may be shortened by connecting the high impedance resistor of an amplifier to a predetermined voltage source during startup.

DETAILED DESCRIPTION OF THE EXEMPLARY EMBODIMENTS

Hereinafter, a startup circuit, a capacitive sensor amplification device having the startup circuit, and a startup method for the amplification device according to embodiments of the present invention will be described in detail with reference to the attached drawings.

It is apparent that the following embodiments of the present invention are merely intended to embody the present invention and are not intended to limit or restrict the scope of the present invention. Configurations that can be easily derived by those skilled in the art to which the present invention pertains from the detailed description and embodiments of the present invention are interpreted as being included in the scope of the present invention.

The startup circuit, the capacitive sensor amplification device having the startup circuit, and the startup method for the amplification device according to the present invention may be applied to various application fields that use a capacitive sensor, as well as a microphone, and application fields related to various additional electronic devices.

Figure 1:
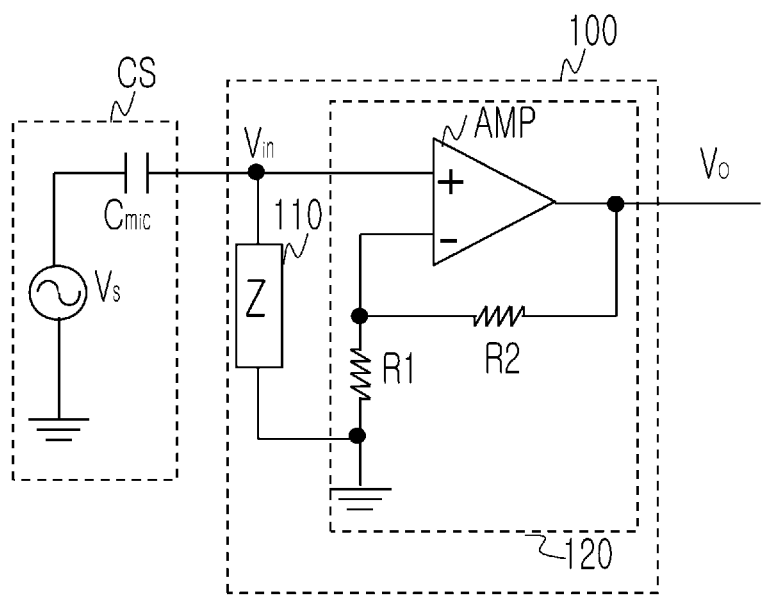
FIG. 1 is a configuration diagram showing an embodiment of a conventional capacitive sensor amplification device.
Figure 2:
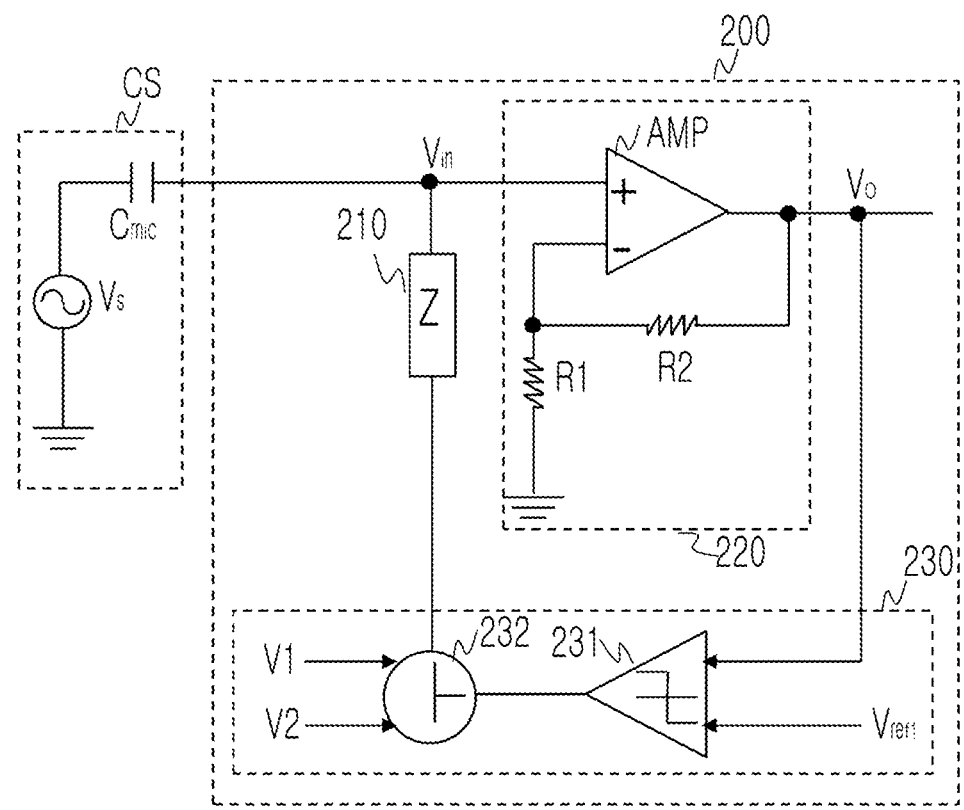
FIG. 2 is a configuration diagram showing a capacitive sensor amplification device having a startup circuit according to a preferred embodiment of the present invention.

First, FIG. 2 is a configuration diagram showing a capacitive sensor amplification device 200 having a startup circuit according to a preferred embodiment of the present invention.

As can be seen in FIG. 2, the capacitive sensor amplification device 200 according to the present invention includes an impedance unit 210, an amplification unit 220, and a startup circuit 230.

First, a sensor circuit CS connected to the amplification device 200 of the present invention includes an input Alternating Current (AC) power source Vs and a capacitive sensor (Cmic) that is a condenser for a microphone. The capacitive sensor Cmic according to the present invention may be the sensor of an individual element using electret or may be implemented as a condenser-type silicon Micro Electro Mechanical System (MEMS) microphone integrated in a semiconductor substrate.

The impedance unit 210 functions to maintain a predetermined bias at the input stage node of the amplification unit 220, and is implemented as a high impedance element having a high impedance value corresponding to a predetermined value or more. That is, the impedance unit 210 is characterized in that it has an impedance value corresponding to a predetermined value or more. In accordance with the present invention, it is preferable that one end of the impedance unit 210 be connected to the output of a switch 232 included in the startup circuit 230, and the other end of the impedance unit 210 be connected to the output of the sensor circuit CS, that is, the output of the capacitive sensor Cmic. That is, the output of the switch 232 is connected to the input stage of the amplification unit 220 via the impedance unit 210.

Next, the amplification unit 220 functions to amplify the output signal of the sensor circuit CS, that is, the output signal of the capacitive sensor Cmic.

The amplification unit 220 of the present invention may be configured using an amplifier AMP and a feedback block. That is, it is preferable that the output Vo of the amplifier AMP be fed back to one input thereof via two resistors included in the feedback block, that is, a first resistor R1 and a second resistor R2. That is, a positive (+) input terminal that is one of the inputs of the amplifier AMP is connected to one end of the impedance unit 210, and a negative (−) input terminal that is the other of the inputs forms a negative feedback circuit through which the output Vo of the amplifier AMP is fed back and input. The amplifier AMP of the present invention may be implemented using a typical operational amplifier.

The startup circuit 230 of the present invention functions to improve the startup time of the amplification unit 220, thus consequently improving the startup time of the capacitive sensor amplification device 200 according to the present invention.

In detail, the startup circuit 230 according to the present invention includes a comparator 231 and a switch 232.

That is, the comparator 231 of the present invention receives the output Vo of the amplification unit 220 as a first comparison signal, receives a preset reference voltage Vref1 as a second comparison signal, compares the comparison signals with each other, and outputs a comparison result. Further, the switch 232 selects and outputs one of preset first and second voltages V1 and V2 depending on the output of the comparator 231.

More specifically, the first voltage V1 is voltage greater than either a supply voltage VDD applied to the amplification unit 220 or the reference voltage Vref1, and the second voltage V2 is a ground GND voltage applied to the amplifier AMP.

Preferably, the startup circuit 230 selects and outputs the first voltage V1 when the first comparison signal is equal to or greater than the second comparison signal, and selects and outputs the second voltage V2 when the first comparison signal is less than the second comparison signal.

In the capacitive sensor amplification device 200 of the present invention and the sensor circuit CS related thereto, the amplification unit 220 may be implemented as an Application Specific Integrated Circuit (ASIC), and the sensor circuit CS and the startup circuit 230 may be implemented as separate individual devices. Further, the amplification unit 220 and the startup circuit 230 may be implemented as a single ASIC and may then be integrated into a single chip.

The above-described capacitive sensor amplification device 200 according to the present invention is operated as follows.

First, the startup circuit 230 senses the output voltage Vo of the amplifier AMP that reflects the input voltage Vin of the amplifier AMP, and detects whether or not the input voltage Vin of the amplifier AMP is a desired bias voltage. It is difficult to connect an additional circuit, such as a switch or an amplifier, to the input node of the amplifier AMP. Since the input node is a high impedance node that operates sensitively to parasitic components and micro-variations, the additional circuit is connected to the input node through high impedance Z of the impedance unit 210.

The comparator 231 receives, as inputs, the output voltage Vo of the amplifier AMP that reflects the input voltage Vin of the amplifier AMP and the reference voltage Vref1 that is a voltage desired to be compared, and compares the two signals with each other. When the output voltage Vo of the amplifier AMP>reference voltage Vref1 is satisfied, the switch 232 connects the voltage greater than the supply voltage VDD or the reference voltage Vref1 to the impedance unit 210. Further, when output voltage Vo<reference voltage Vref1 is satisfied, the switch 232 connects the ground that is an original contact point, that is, a ground terminal, to the impedance unit because the node of the output voltage Vo of the amplifier AMP indicates the completion of an initialization operation.

As the value of a voltage Vref2 greater than the supply voltage VDD or the reference voltage Vref1, the voltage enabling rapid initialization is selected in consideration of the configuration of the circuit.

For reference, the initialization (startup) time may be represented by the following Equation 1:

$$t_s = \frac{1}{Z * C_{mic}} * (V_{ref2} - Vin) \qquad \text{Equation 1}$$

By selecting the voltage Vref2 greater than the suitable reference voltage Vref1, a suitable initialization time may be set.

The startup circuit 30 of the present invention may be applied to various different types of electronic devices EDs, as well as the capacitive sensor amplification device 200. However, in order to apply the startup circuit 30 of the present invention to the electronic devices EDs, each ED may preferably include a high impedance amplifier AMP.

Figure 3:
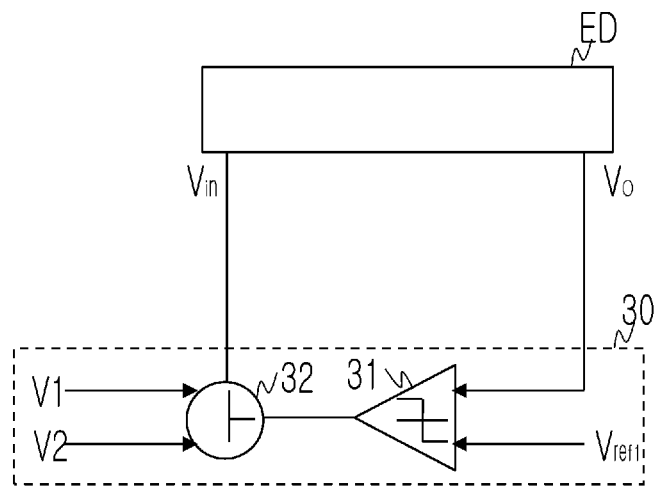
FIG. 3 is a configuration diagram showing a startup circuit according to a preferred embodiment of the present invention, applied to an electronic device.

FIG. 3 is a configuration diagram showing a startup circuit 30 according to a preferred embodiment of the present invention applied to an electronic device ED. As can be seen in FIG. 3, the startup circuit 30 according to the preferred embodiment of the present invention includes a comparator 31 and a switch 32.

The comparator 31 receives the output Vo of the electronic device ED as a first comparison signal, receives a preset reference voltage Vref1 as a second comparison signal, compares the comparison signals with each other, and outputs a comparison result. Further, the switch 32 selects and outputs one of first and second voltages V1 and V2 depending on the output of the comparator 31.

The output of the switch 32 is preferably connected to the electronic device ED. In detail, the output of the switch 32 is preferably connected to one end of an input impedance unit included in the electronic device ED. Further, the other end of the input impedance unit included in the electronic device ED is connected to the input signal Vin of the electronic device ED. That is, the output of the switch 32 is connected to the input of the electronic device ED via an impedance unit having an impedance value corresponding to a predetermined value or more. Further, the first voltage V1 is a voltage greater than either a supply voltage VDD applied to the electronic device ED or the reference voltage Vref1, and the second voltage V2 is a ground voltage applied to the electronic device ED. Preferably, the startup circuit 30 selects and outputs the first voltage V1 when the first comparison signal is equal to or greater than the second comparison signal, and selects and outputs the second voltage V2 when the first comparison signal is less than the second comparison signal.

Figure 4:
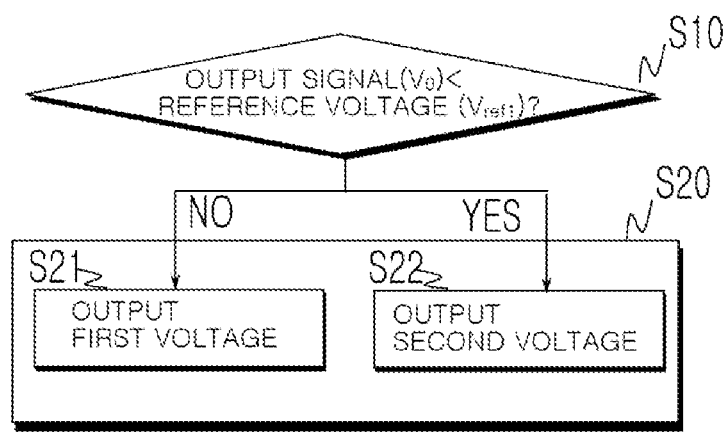
FIG. 4 is a flowchart showing a startup method for the capacitive sensor amplification device according to an embodiment of the present invention.

FIG. 4 is a flowchart showing a startup method for the capacitive sensor amplification device 200 according to an embodiment of the present invention.

As can be seen in FIG. 4, the startup method of the present invention includes the step S10 of comparing the output signal Vo of the amplification device 200 with a preset reference voltage Vref1 and the step S20 of selecting and outputting one of first and second voltages V1 and V2 depending on the result of the comparison at step S10.

More specifically, step S20 preferably includes the step S21 of, when the output signal Vo of the amplification device 200 is equal to or greater than the reference voltage Vref1, selecting and outputting the first voltage V1, and the step S22 of, when the output signal Vo of the amplification device 200 is less than the reference voltage Vref1, selecting and outputting the second voltage V2.

Further, the first voltage V1 is the voltage greater than either a supply voltage VDD applied to the amplification device 200 or the reference voltage Vref1, and the second voltage V2 is a ground voltage applied to the amplification device 200. Furthermore, the output at step S20 is preferably applied to one end of the impedance unit 210 that is included in the amplification device 200 and that has an impedance value corresponding to a predetermined value or more.

As described above, the present invention provides a method for connecting an input high impedance resistor to a predetermined reference voltage Vref1, thus shortening a startup time required to reach a normal operation from an initial value. That is, in accordance with the startup circuit 230 and the capacitive sensor amplification device 200 having the startup circuit 230 according to the embodiments of the present invention, when the voltage of an input node in initial values is different from a desired voltage, a specific voltage is connected to a high impedance resistor to realize a rapid variation to a DC bias, thus shortening initial startup time.

The startup circuit, the capacitive sensor amplification device having the startup circuit, and the startup method for the amplification device according to the present invention may be applied to not only microphones, but also various application fields using capacitive sensors and application fields related to various other electronic devices.

What is claimed is:

1. A startup circuit for an electronic device, comprising:
   a comparator for receiving an output of the electronic device as a first comparison signal, receiving a preset reference voltage as a second comparison signal, comparing the comparison signals with each other, and outputting a comparison result; and a switch for selecting and outputting one of a first voltage and a second voltage depending on the output of the comparator, wherein the first voltage is a voltage greater than either a supply voltage applied to the electronic device or the reference voltage, and the second voltage is a ground voltage applied to the electronic device, and wherein the startup circuit is configured to select and output the first voltage when the first comparison signal is equal to or greater than the second comparison signal, and select and output the second voltage when the first comparison signal is less than the second comparison signal.

2. The startup circuit of claim 1, wherein the output of the switch is connected to the electronic device.

3. A capacitive sensor amplification device, comprising:
an amplification unit for amplifying a signal input to the amplification device; and
a startup circuit for improving a startup time of the amplification unit,
wherein the startup circuit comprises:
a comparator for receiving an output of the amplification unit as a first comparison signal, receiving a preset reference voltage as a second comparison signal, comparing the comparison signals with each other, and outputting a comparison result; and a switch for selecting and outputting one of a first voltage and a second voltage depending on the output of the comparator, wherein the first voltage is a voltage greater than either a supply voltage applied to the amplification unit or the reference voltage, and the second voltage is a ground voltage applied to the amplification unit, and wherein the startup circuit is configured to select and output the first voltage when the first comparison signal is equal to or greater than the second comparison signal, and select and output the second voltage when the first comparison signal is less than the second comparison signal.

4. The capacitive sensor amplification device of claim 3, further comprising an impedance unit having a first end connected to the output of the switch and a second end connected to an output of a capacitive sensor, the impedance unit having an impedance value corresponding to a predetermined value or more.

5. The capacitive sensor amplification device of claim 4, wherein the amplification unit is connected to the first end of the impedance unit and is configured to amplify the output of the capacitive sensor.

* * * * *